United States Patent
Kim

(10) Patent No.: US 7,512,845 B2
(45) Date of Patent: Mar. 31, 2009

(54) SEMICONDUCTOR MEMORY DEVICE AND METHOD FOR STACKING REFERENCE DATA

(75) Inventor: Jae-kwan Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 55 days.

(21) Appl. No.: 10/863,518

(22) Filed: Jun. 9, 2004

(65) Prior Publication Data
US 2005/0027922 A1 Feb. 3, 2005

(30) Foreign Application Priority Data
Jun. 9, 2003 (KR) .................. 10-2003-0036745

(51) Int. Cl.
*G11C 29/00* (2006.01)
*G11C 7/00* (2006.01)

(52) U.S. Cl. ............................. 714/718; 365/201

(58) Field of Classification Search ........... 714/718, 714/721; 365/200–201
See application file for complete search history.

(56) References Cited

U.S. PATENT DOCUMENTS

| | | | |
|---|---|---|---|
| 4,347,606 A | 8/1982 | Hoogeveen | |
| 6,058,056 A | 5/2000 | Beffa et al. | |
| 6,157,999 A * | 12/2000 | Rossbach et al. | 712/243 |
| 6,353,903 B1 | 3/2002 | Adams et al. | |
| 6,438,720 B1 | 8/2002 | Boutaud et al. | |
| 6,457,148 B1 * | 9/2002 | Yoshiba | 714/718 |
| 6,510,530 B1 | 1/2003 | Wu et al. | |
| 6,535,993 B1 * | 3/2003 | Hamada et al. | 714/6 |
| 7,007,215 B2 | 2/2006 | Kinoshita et al. | |
| 7,028,236 B2 * | 4/2006 | Okazaki | 714/718 |
| 2001/0013110 A1 | 8/2001 | Pierce et al. | |
| 2002/0078408 A1 * | 6/2002 | Chambers et al. | 714/718 |
| 2002/0138797 A1 * | 9/2002 | Beaujoin et al. | 714/718 |
| 2003/0237033 A1 * | 12/2003 | Borri et al. | 714/718 |
| 2004/0133827 A1 * | 7/2004 | Norris et al. | 714/718 |
| 2005/0050419 A1 * | 3/2005 | Kapur et al. | 714/728 |

OTHER PUBLICATIONS

"DISC: dynamic instruction stream computer-an evaluation of performance" by Donalson et al. Proceeding of the Twenty-Sixth Hawaii International Conference on System Sciences, 1993 Publication Date: Jan. 5-8, 1993 vol. i, On pp. 448-456 vol. 1 ISBN: 0-8186-3230-5 INSPEC Accession No. 4613051.*
Schilling, Donald L. & Belove, Charles; Registers, Counters, and Arithmetic Circuits; Electronic Circuits: Discrete and Integrated, Second Edition, Copyright 1979; pp. v-vi and 648-650; McGraw-Hill Book Company; United States of America.
Taub, Herbert & Schilling, Donald; Registers and Counters; Digital Integrated Electronics; Copyright 1977; pp. v-vi and 325-326; McGraw-Hill Book Company; United States of America.

* cited by examiner

*Primary Examiner*—Cynthia Britt
(74) *Attorney, Agent, or Firm*—Volentine & Whitt, PLLC

(57) ABSTRACT

A semiconductor memory device for compensating latency by stacking reference data. The semiconductor memory device compensates the latency and test errors between two signals by detecting the latency of the two signals and stacking the reference data without using an extra signal. Accordingly, a system can be simplified and power consumption can be reduced when testing the semiconductor memory device, since the extra circuit is unnecessary to synchronize a data sync signal with output data.

20 Claims, 7 Drawing Sheets

SEMICONDUCTOR MEMORY DEVICE AND METHOD FOR STACKING REFERENCE DATA

BACKGROUND OF THE INVENTION

1. Field of the Invention

Embodiments of the present invention relate to a semiconductor memory device, a test circuit of a semiconductor memory device, and/or a test method.

This application claims the priority of Korean Patent Application No. 2003-36745, filed on Jun. 9, 2003, in the Korean Intellectual Property Office, the disclosure of which is incorporated herein in its entirety by reference.

2. Description of the Related Art

A memory cell test is one of the most important processes during manufacturing of a semiconductor memory device (e.g. a dynamic random access memory (DRAM) and a read only memory (ROM)). In the memory cell test, it is determined if the semiconductor memory device is working properly by confirming that data output from memory cells under test meets the expected test values. During a memory cell test, there is latency between reference data input into the tested memory device during a write operation and data reference data output from the memory device during a read operation. Latency is the processing time required for reading and writing data after inputting the reference data in the semiconductor memory device. Latency may be influenced by the process of reading and writing data, physical characteristics of signal lines, and circumstances under which the semiconductor memory device operates.

In the process of detecting an error by comparing the reference data and the data output from the tested memory device, a common starting point between the reference data and the output data should be set. Once the starting points of the reference data and the output data are respectively detected, a comparison of the data can occur. In order to do this, a circuit compensating latency between the reference data and the output data is needed.

Initially, a starting point of the reference data and output data should be determined. For the reference data, a starting signal can be directly produced when generating data outside of a device. Although the starting signal may be generated inside of the device, it can be easily detected since the starting signal is generated by a control signal which originates outside of the device. For the output data, an exact data starting point is not easily detected since the data is generated at the tested memory device. That is, it is very difficult to estimate a definite starting point of the output data value in advance because latency between memory devices varies. However, a value range of the starting point may be estimated based on typical results. The variation in latency may be influenced by on-chip variations, circumstances under which the semiconductor memory device operates, and connecting structures of the semiconductor memory device. Accordingly, an extra signal which is generated outside is used to indicate the starting point of output data in a related art method.

FIG. 1 is a drawing illustrating a related art latency processing method. The DATA SYNC SIGNAL is a signal indicating a start of the OUTPUT DATA. A system outside of the semiconductor memory device detects an error by recognizing the OUTPUT DATA as meaningful data when the DATA SYNC SIGNAL is changed from a first logic state to a second logic state, after inputting the REFERENCE DATA in the semiconductor memory device. The activation of the DATA SYNC SIGNAL, indicates a starting point of the OUTPUT DATA. An extra signal line is necessary (e.g. the DATA SYNC SIGNAL for informing the start of the OUTPUT DATA. Accordingly, the starting point of the OUTPUT DATA can be checked by using the extra signal line. Moreover, another method for detecting latency is by latching the OUTPUT DATA, as disclosed in Korean Patent No. 1997-62994. In this method, an extra circuit is necessary to synchronize the DATA SYNC SIGNAL outside of the semiconductor memory device, thereby complicating a system, causing a delay of signals, and increasing power consumption.

SUMMARY OF THE INVENTION

Embodiments of the present invention relate to a semiconductor memory device that test errors between two signals by compensating latency of the two signals. Stacking reference data is utilized without using an extra signal. According to aspects of embodiments of the present invention, a semiconductor memory device includes a memory cell array unit, an output shift register, a reference shift register, and a comparison unit. The memory cell array unit sequentially receives data bits of reference data, forming a data pattern of N bits. The memory cell array unit stores the data bits in memory cells when performing writing operations and sequentially outputs output data, which is read in the received order of the data bits stored in the memory cells.

The output shift register stores data bits of the output data sequentially shifting received data bits of the output data. The output shift register outputs the stored N data bits. The reference shift register stores data bits of the reference data after updating the data bits by stacking or shifting sequentially received data bits, according to stack or shift information. The reference shift register outputs N data bits located in a shift direction, including data located in an initial stack location of the reference data. The comparison unit compares N data bits output from the reference shift register from N data bits placed in corresponding locations to the above N data bits output to the output shift register. The comparison unit outputs the stack or shift information as either a first or second logic state, depending on whether the compared bits are different or not.

The reference shift register comprises a control register, a stack register, and a comparison register. The control register generates stack and shift control information based on the first and second logic states of the stack or shift information. In the first logic state, the control register sequentially outputs the reference data bits to a stack location. In the second logic state, the control register outputs the reference data bits to a previous stack location. The stack register receives the data bits output to the stack location, excluding the data bits output to the initial stack location. The stack register stores the data bits after updating the data bits by stacking bit by bit in an opposite direction to the shift direction in response to the stack control information. The stack register stores the data bits after updating the data bits by shifting bit by bit to the shift direction in response to the shift control information.

The comparison register receives and stores the data bits output to the initial stack location. The comparison register stores the data bits after updating the stored data bits by shifting bit by bit in response to the shift control information. The comparison register stores the final data toward the shift direction in the initial stack location, which is shifted and output from the stack register, when storing the updated data bits by shifting and outputting N data bits located in the shift direction, including the data located in the initial stack location. The output data and the stack or shift information are output to the outside of the semiconductor memory device by an output pin, bonded to a pad. The stack register stacks the reference data to compensate for latency between writing and reading operations and stores the data.

According to aspects of embodiments of the present invention, a test of a semiconductor memory device may comprise the following. Sequentially receiving data bits of reference data forming a data pattern of N bits. Storing the data bits in memory cells when performing writing operations. Sequentially outputting output data which is read according to a receiving order of the data bits stored in the memory cells when performing reading operations. Storing data bits of the output data after updating the data bits by bit by bit shifting, when sequentially receiving the data bits of the output data. Outputting the stored N data bits. Storing data bits of the reference data after updating the data bits by shifting bit by bit or stacking bit by bit according to stack or shift information when sequentially receiving the data bits. Outputting N data bits located in a shift direction including data placed in an initial stack location of the reference data. Comparing N data bits of the output data to N data bits of the reference data placed in corresponding locations to the N data bits. Outputting the stack or shift information having first and second logic states, respectively, based on a comparison of the bits.

Outputting the N data bits of the reference data may comprise the following. Generating stack and shift control information respectively corresponding to the first and second logic states of the stack or shift information. Outputting the data bits received in the first logic state to a stack location and the data bits received in the second logic state to a previous stack location when sequentially receiving the data bits of the reference data. Receiving the data bits output to the stack location excluding the data bits output to the initial stack location. Storing the data bits after updating the data bits by stacking bit by bit in an opposite direction to the shift direction in response to the stack control information. Storing the data bits after updating the data bits by shifting bit by bit to the shift direction in response to the shift control information. Receiving and storing the data bits output to the initial stack location. Storing the data bits after updating the stored data bits by shifting bit by bit in response to the shift control information. Storing the final data toward the shift direction in the initial stack location, which is shifted and output from the stack location when storing the updated data bits by shifting. Outputting the N data bits located in the shift direction including the data located in the initial stack location.

DETAILED DESCRIPTION OF THE INVENTION

Figure 1:
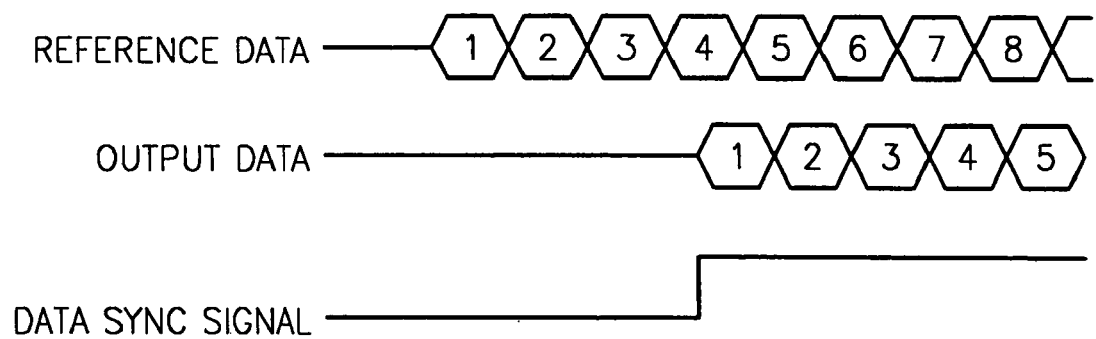
FIG. 1 is a drawing illustrating a background art latency processing method.
Figure 2:
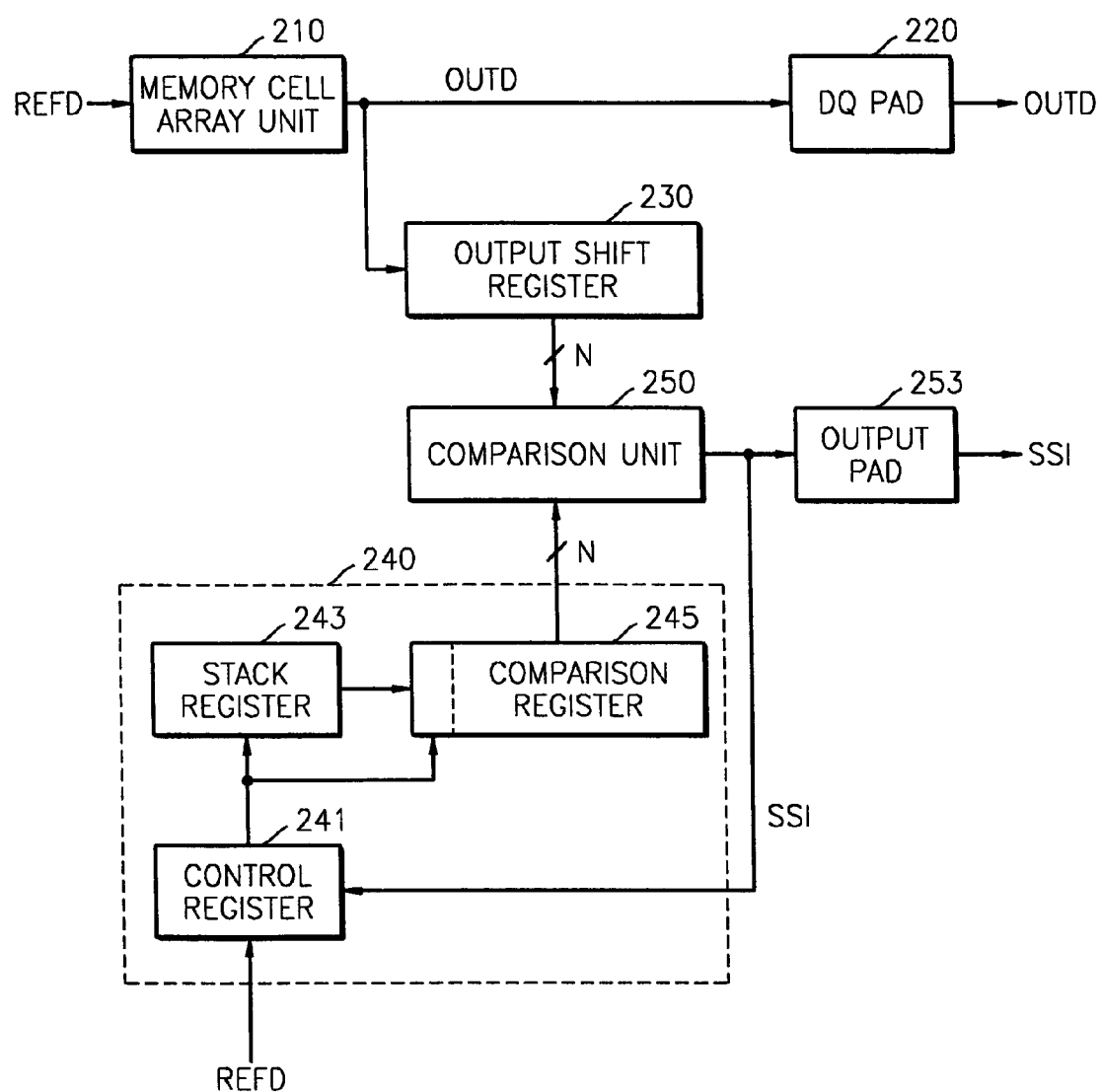
FIG. 2 is an exemplary block diagram of a semiconductor memory device.

FIG. 2 is an exemplary block diagram of a semiconductor memory device according to embodiments of the present invention. The semiconductor memory device includes the memory cell array unit 210, the output shift register 230, the reference shift register 240, and the comparison unit 250. Further, the semiconductor memory device also includes the DQ pad 220 and the output pad 253 that are respectively connected to an output pin (not shown) and a bonding wire (not shown) in order to output output data OUTD and stack or shift information SSI.

Figure 4:
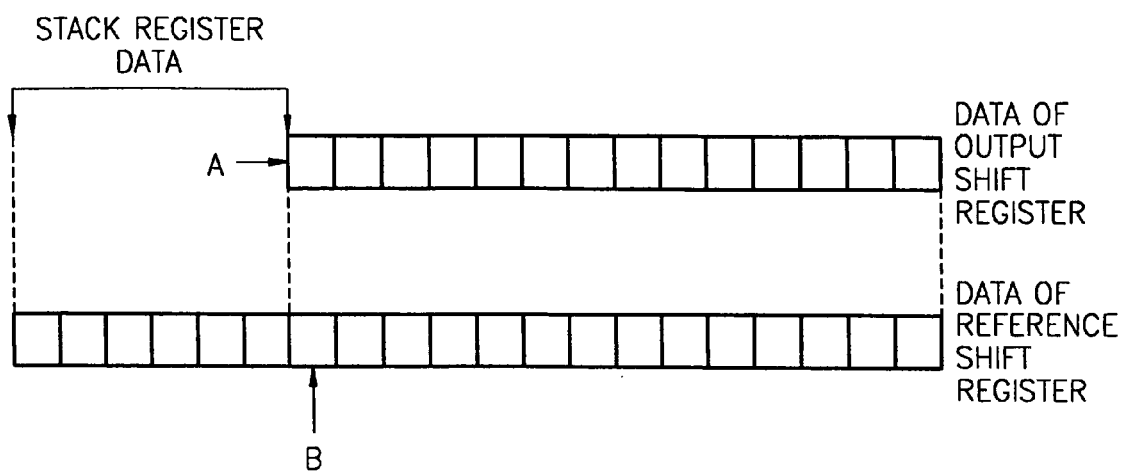
FIG. 4 is an exemplary drawing illustrating a structure of data stored in a shift register.

While writing data, the memory cell array unit 210 sequentially receives data bits of reference data REFD formed of a data pattern of N bits and stores the data bits of the reference data REFD in memory cells. While reading data, the memory cell array unit 210 sequentially outputs the output data OUTD which is read based on the order the data bits of the reference data REFD (stored in the memory cells) were received. While sequentially receiving the data bits of the output data OUTD, the output shift register 230 stores the data bits of the output data OUTD, after updating the data bits by shifting bit by bit and outputs the stored N data bits. The output shift register 230, as shown in FIG. 4, has a data structure similar to a general shift register. Accordingly, in FIG. 4, data bits at a point A are sequentially received and stored after being synchronized with a predetermined clock and updated by shifting bit by bit in a rightward direction.

Figure 3:
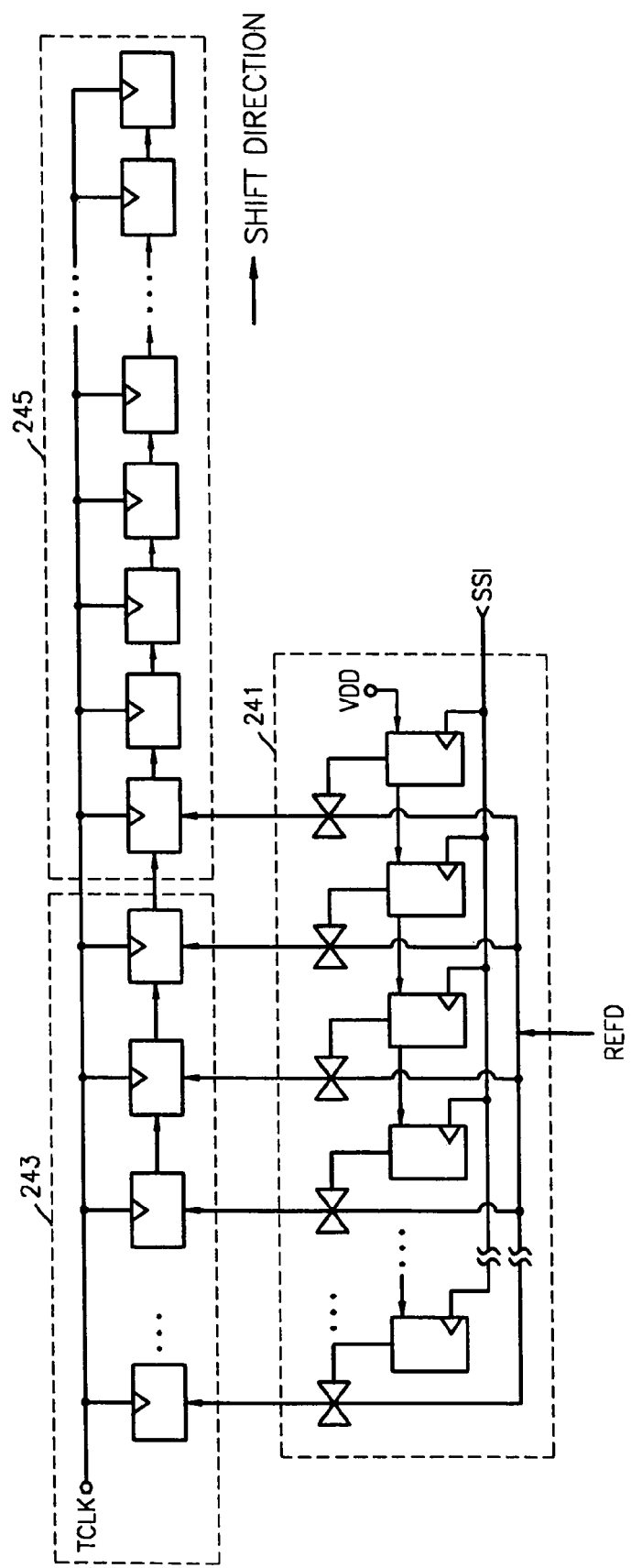
FIG. 3 is an exemplary block diagram of a reference shift register of FIG. 2.

The reference shift register 240 stores the data bits after updating the data bits by stacking or shifting corresponding to the stack or shift information SSI when sequentially receiving the data bits of the reference data REFD. The reference shift register 240 outputs the N data bits located in a shifting direction, including the data bit located in an initial stack location or a point B of the reference data REFD. The reference shift register 240, as shown in FIG. 4, has a data structure in which the first received data bit stored at the point B (or the initial stack location) and the subsequently received data bits are sequentially received and stored after being synchronized with a predetermined clock by stacking bit by bit in a leftward direction or shifting in a rightward direction in FIG. 4. The reference shift register 240, shown in FIG. 2, includes a control register 241, a stack register 243, and a comparison register 245. FIG. 3 is a block diagram of the reference shift register 240 of FIG. 2.

Referring to FIGS. 2 and 3, when the control register 241 sequentially receives the data bits of the reference data REFD, the control register 241 generates stack and shift control information corresponding to first and second logic states of the SSI. The control register 241 outputs the data bits received in the first logic state to a stack location and the data bits received in the second logic state to a previous stack location. The stack location indicates a location shifted by one bit to a stack direction. When outputting the data bits of the reference data REFD to the stack location, the data is only stacked to the stack direction where there is no data shift. However, when outputting the data bits received in the second logic state to the previous stack location, all data located in the shift direction, including the data located in the previous stack location, are synchronized with the predetermined clock, and thereafter shifted bit by bit. This shift of the stack location, as illustrated in FIG. 3, is easily embodied by controlling a switch (e.g. a pass gate).

The stack register 243 receives the data bits output to the stack location, excluding the initial stack location (i.e. point B in FIG. 4). The stack register 243 stores the data bits after updating the data bits by stacking bit by bit in an opposite direction to the shift direction in response to the stack control information, or after updating the data bits by shifting the data bits in the shift direction in response to the shift control information. The stack register 243 can perform stack and shift operations. The stack register 243 stores as much of the reference data REFD that is needed to compensate for the latency between data reading and writing.

The comparison register 245 receives and stores the data bits output to the initial stack location (i.e. point B in FIG. 4), The comparison register 245 stores the data bits after updating the data bits by shifting bit by bit in response to the shift control information. In addition, when storing the data bits updated by shifting, the comparison register 245 stores a final data toward the shift direction in the initial stack location, which is shifted and output from the stack register 243. The comparison register 245 outputs the N data bits toward the shift direction including the data located in the initial stack location.

The comparison unit 250 compares the N data bits output to the output shift register 230 with the N data bits output to the reference shift register 240. If the two sets of N data bits are the same, the comparison unit 250 outputs the stack or shift information SSI having the second logic state. If the two sets of N data bits are different, the comparison unit 250 outputs the stack or shift information SSI having the first logic state. The DQ pad 220 and the output pad 253 are included in the semiconductor memory device to output the output data OUTD and the stack or shift information SSI at an output pin connected through bonding wire on the package. Data output by the DQ pad 220 may be DQ output data OUTD that is used in a general test of a semiconductor device. Data output by the DQ pad 220 may also be used in determining normal operations or inputting OUTD to another device. The data is output to the outside of the semiconductor device when it is working properly.

A user performing a test may be able to determine whether the semiconductor memory device is working properly based on the stack or shift information SSI output by the output pad 253. In other words, the number of bits or the bit value of the logic state of the stack or shift information SSI becomes a reference value to determine whether the semiconductor memory device is working properly since the stack and shift control information occurs according to the first and second logic states of the stack or shift information SSI.

For instance, in case that erroneous data bits exist as the data bits in the pertinent shift register before the outputting of the output data OUTD and the reference data REFD, the stack or shift information SSI maintains the same logic state without changing to another logic state, although a normal latency time period has passed. In this case, the stack register 243 and the comparison register 245 are updated by stacking. The stack or shift information SSI still maintains the same logic state after the latency. Thus, the user may decide that an error occurred at the beginning. Thereafter, the semiconductor memory device is reset and tested again. If the same problem occurs, the semiconductor memory device is determined to be defective.

Errors may exist after compensating for the latency by the stack or shift information SSI. In a case where the stack or shift information SSI changes from the first logic state to the second logic state during the test, if the semiconductor memory device works properly, the stack or shift information SSI maintains the second logic state until the end of the test. The stack register 243 and the comparison register 245 are updated by shifting during a period when the stack or shift information SSI is in the second logic state. Thus, if the stack or shift information SSI changes from the second logic state to the first logic state during the test, the tested semiconductor memory device is determined to be defective, since the output data OUTD and the reference data REFD are different.

Figure 5:
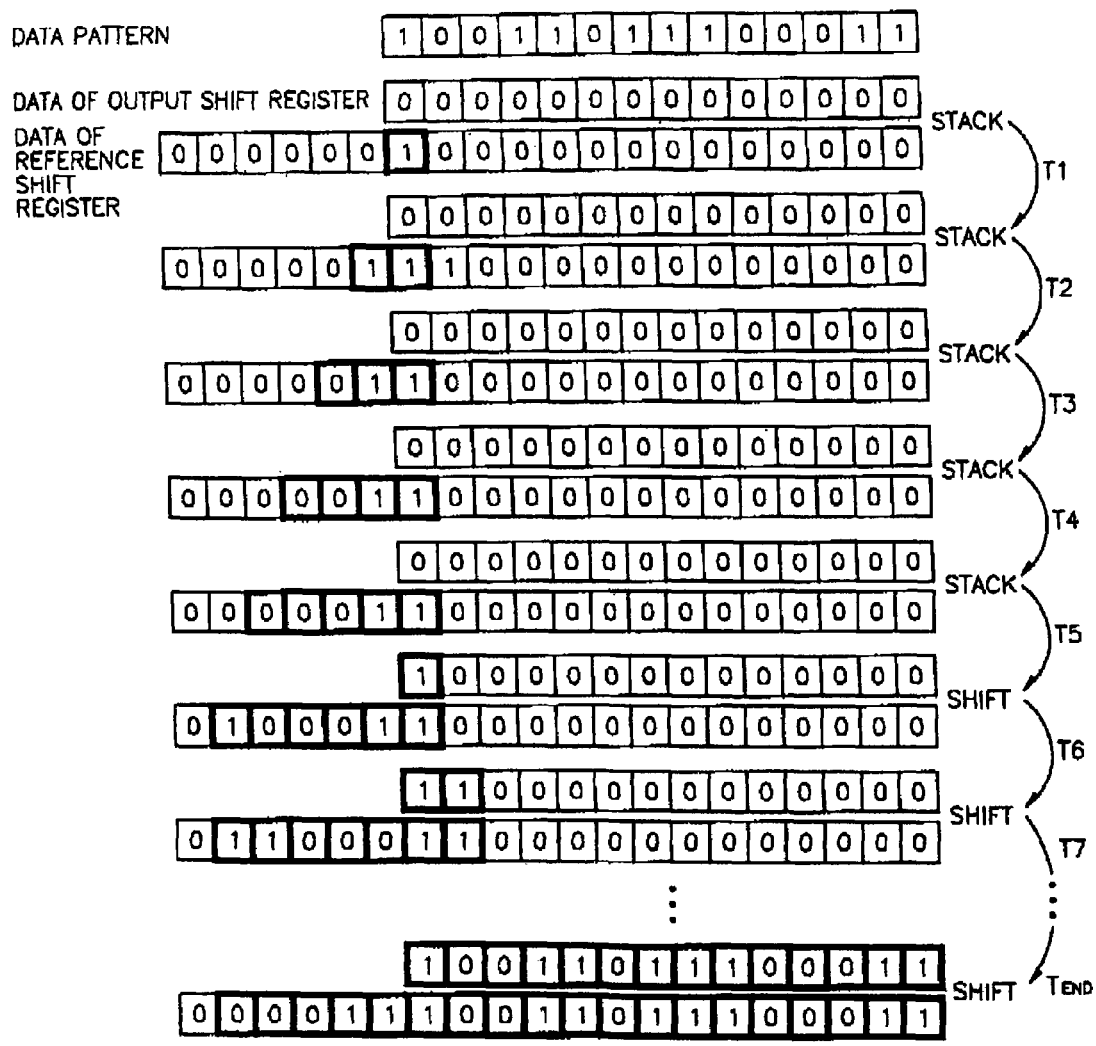
FIG. 5 is an exemplary drawing illustrating operations of a shift register when an initial output data is "1".

FIG. 5 is a drawing illustrating example operation of shift registers when an initial output data OUTD is "1". In FIG. 5, an exemplary N bit data pattern forming the reference data REFD is "10011011100011". In this example, the latency of the tested memory device is the time required to output five data bits. Specifically, the latency is the time between the input of REFD into the tested memory device and the output of OUTD from the tested memory device. The least significant data bits of the reference data REFD is "1" and is stored to the initial stack location of the comparison register 245 at time T1. At time T1, the N data bits of the comparison register 245 and the corresponding N data bits of the output shift register 230, are different. Accordingly, the stack or shift information SSI in the first logic state are output. Because the SSI is in the first logic state, the control register 241 generates the stack control information and the data bit received at T2 or "1" is output to the next stack location of the stack register 243. Likewise, the stack or shift information SSI in the first logic state is output at T2 and the stack or shift information SSI maintains the first logic state during the latency (T1~T5). At T6, the sixth data bit of the reference data REFD or "1" is stored in the pertinent stack location. Also, at T6, the output data OUTD starts to be stored in the output shift register 230. The least significant data bits of the data pattern or "1" is output from the memory cell array unit 210 into the output shift register 230. Accordingly, the stack or shift information SSI changes from the first logic state to the second logic state. Consequently, the control register 241 generates the shift control information. When the shift control information is generated, the next data bit of the reference data REFD is stored in a previous stack location in the reference shift register 240. All data placed in the shift direction, including the data stored in the previous stack location, are shifted bit by bit. If the stack or shift information SSI of the semiconductor memory device under test maintains the second logic state, the output data OUTD outputs all data of the data pattern at $T_{END}$. This latency compensation may vary according to the type of data pattern or depending if the least significant data bit (or the initial bit of data) of the data pattern of the reference data REFD is a "0" or "1".

Figure 6:
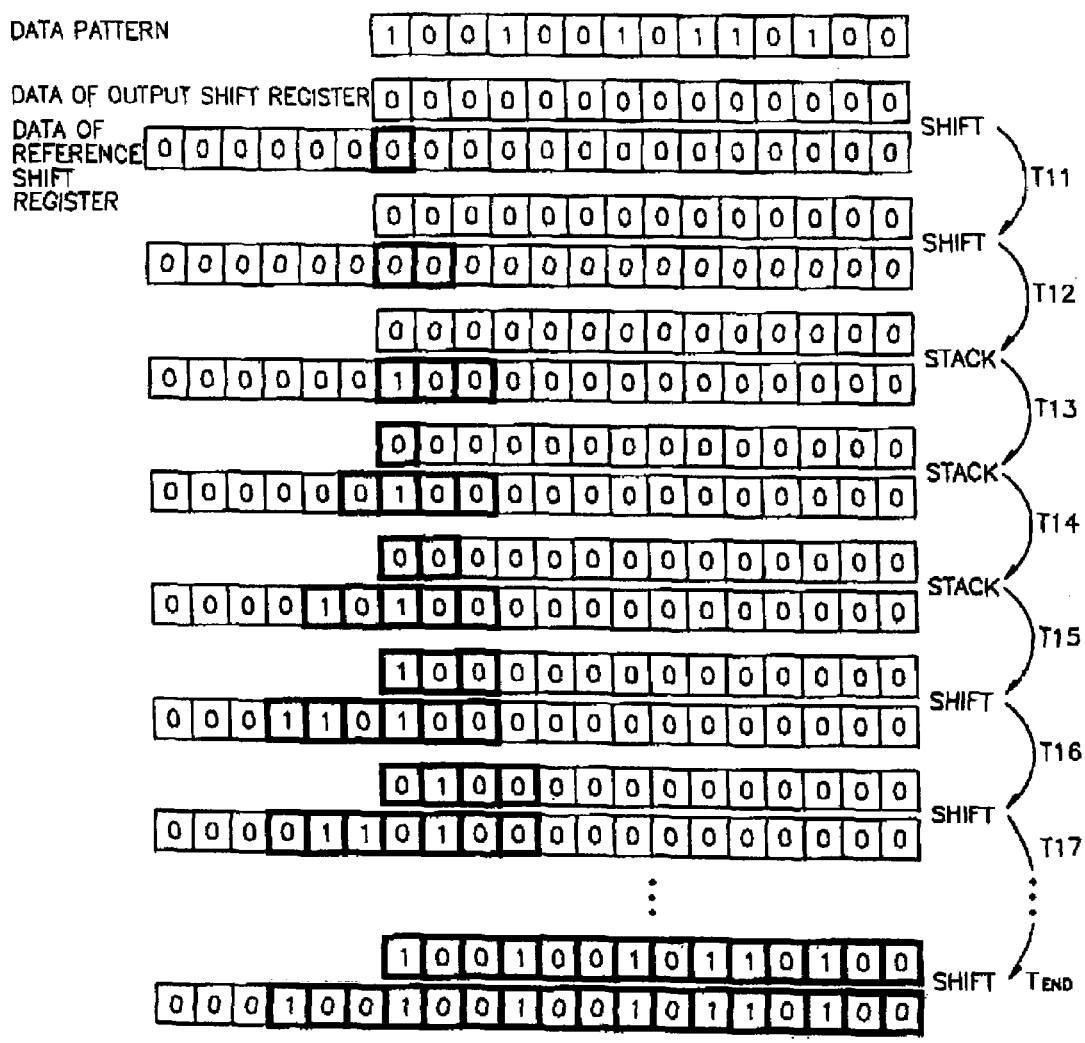
FIG. 6 is an exemplary drawing illustrating operations of a shift register when an initial output data is "0".
Figure 7:
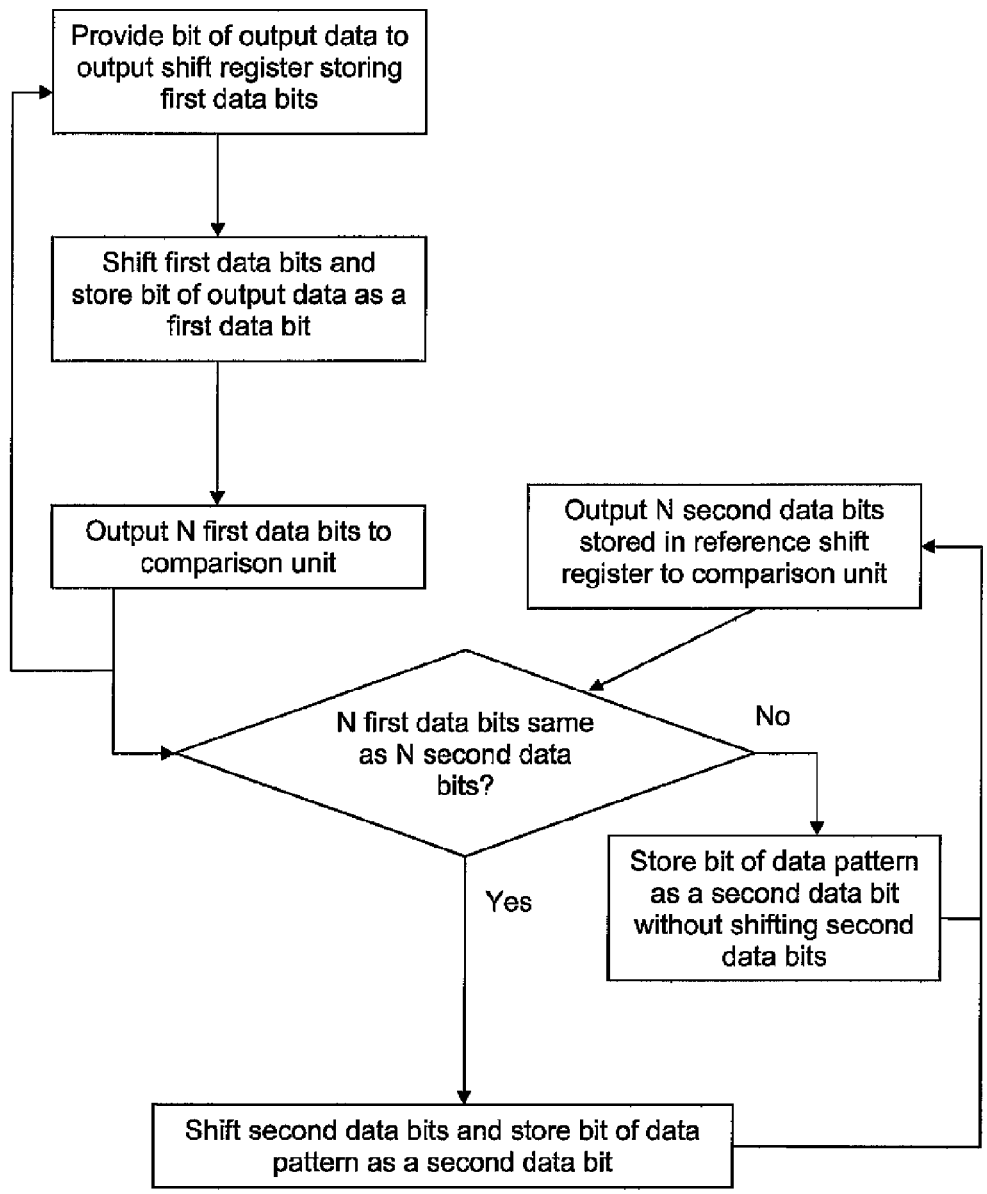
FIG. 7 is a flow chart illustrating a method in accordance with an embodiment of the invention.

FIG. 6 is a drawing showing example operations of shift registers when an initial output data OUTD is "0". In FIG. 6, an exemplary N bit data pattern forming the reference data REFD is "10010010110100". It may be assumed that a latency (i.e. a starting time of outputting the output data OUTD after the reference data REFD is input) is the time required to output three data bits. The least significant data bits of the reference data REFD of "0" is first stored at T11 to the initial stack location of the comparison register 245.

At T11, the N data bits of the comparison register 245 and the corresponding location of the N data bits of the output shift register 230, are the same. Accordingly, the stack or shift information SSI of the second logic state is output. Specifically, the control register 241 generates shift control information and the data bits received at T12 of "0" is output to the previous stack location (in this case, the initial stack location) of the comparison register 245 and the previous data stored in the comparison register 245 is shifted to the right. Likewise, the stack or shift information SSI of the second logic state is output at T12. At T13, the third data bit of "1" is stored to the initial stack location of the comparison register 245. However, the stack or shift information SSI of the first logic state is output at T13, since the N data bits of the comparison register 245 and the corresponding location of the N data bits of the output shift register 230 are different. The stack or shift information SSI then maintains the first logic state during the latency (T13~T15).

At T16, where the sixth data bit of the reference data REFD of "1" is stored in the pertinent stack location, the output data OUTD begins to appear as the data pattern or "100". The stack or shift information SSI then changes from the first logic state to the second logic state and the control register 241 generates the shift control information. In a case where the shift control information is generated, the next data bit of the reference data REFD is stored in the previous stack location of the reference shift register 240 and all data placed in the shift direction including the data stored in the previous stack location are shifted bit by bit. If the tested semiconductor memory device works properly, the stack or shift information SSI maintains the second logic state until the output data OUTD outputs all data on the data pattern, at time $T_{END}$.

As described above, in the semiconductor memory device according to embodiments of the present invention, the output shift register 230 stores the data bits after updating the data bits by shifting bit by bit and outputs the N data bits stored when sequentially receiving the data bits of the output data OUTD. The reference shift register 240 stores the data bits corresponding to the SSI after updating the data bits by stacking or shifting bit by bit when sequentially receiving the data bits of the reference data REFD and outputs the N data bits located in the shift direction including the data located in the initial stack location of the reference data REFD. Accordingly, the comparison unit 250 compares the N data bits output from the reference shift register 240 and the N data bits output from the output shift register 230. The comparison unit 250 outputs the stack or shift information SSI having either the first or second logic state. A user testing the semiconductor memory device monitors an output state of the stack or shift information SSI and determines whether the semiconductor memory device works properly. The semiconductor memory device, according to embodiments of the present invention, is able to detect the latency between the two signals without an extra signal and tests the error between the two signals by compensating for the latency by stacking the reference data. Accordingly, a system can be simplified and power consumption can be reduced when testing the semiconductor memory device, since the extra circuit is unnecessary to synchronize the data sync signal with output data.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
   a memory cell array unit serially receiving data bits of a data pattern, storing the data bits in memory cells, and serially outputting the data bits as output data;
   an output shift register serially receiving the output data, storing first data bits, outputting N of the first data bits, and updating the first data bits by shifting the first data bits and storing one bit of the output data as one of the first data bits;
   a reference shift register serially receiving the data bits of the data pattern, storing second data bits, outputting N of the second data bits, updating the second data bits using a first update operation when stack or shift information indicates a first logic state, and updating the second data bits using a second update operation when the stack or shift information indicates a second logic state; and
   a comparison unit comparing the N first data bits with the N second data bits and outputting the stack or shift information,
   wherein the logic state of the stack or shift information corresponds to the result of comparing the N first data bits with the N second data bits,
   wherein the first update operation comprises storing one of the data bits received by the reference shift register as one of the second data bits without shifting the second data bits, and
   wherein the second update operation comprises shifting the second data bits and subsequently storing the one of the data bits received by the reference shift register as one of the second data bits.

2. The semiconductor memory device of claim 1, wherein the reference shift register comprises:
   a control register serially receiving the data bits of the data pattern and receiving the stack or shift information;
   a stack register storing a first portion of the second data bits, wherein, when the stack register receives a data bit from the control register, the stack register stores the data bit received from the control register as one of the second data bits without shifting the first portion of the second data bits when the second data bits are updated using the first update operation, and stores the data bit received from the control register as one of the second data bits after shifting the first portion of the second data bits when the second data bits are updated using the second update operation; and
   a comparison register storing a second portion of the second data bits, and outputting N of the second portion of the second data bits.

3. The semiconductor memory device of claim 2, wherein the stack or shift information is output to the outside of the semiconductor memory device by an output pin bonded to a pad.

4. The semiconductor memory device of claim 2, wherein the stack register has a capacity sufficient to store at least a number of the data bits of the data pattern wherein the number of the data bits corresponds to a latency between writing and reading operations in the semiconductor device.

5. The semiconductor memory device of claim 1, wherein the output data is output to the outside of the semiconductor memory device by an output pin bonded to a pad.

6. A method for testing a memory device, comprising:
   sequentially providing output data from a memory device into an output register;
   sequentially inputting reference data into a reference register;
   comparing first data stored in the output register to at least a portion of second data stored in the reference register;
   shifting the first data stored in the output register; and
   shifting the second data stored in the reference register only if the first data was determined to be the same as the at least a portion of the second data in the comparison.

7. The method of claim 6, further comprising:
   if the first data is not the same as the at least a portion of the second data, then updating the second data stored in the reference register with a bit of the reference data without shifting the second data,
   wherein sequentially providing the output data comprises sequentially providing the output data bit by bit, and
   wherein sequentially inputting the reference data comprises sequentially inputting the reference data bit by bit.

8. The method of claim 6, wherein shifting the second data stored in the reference register comprises shifting each bit of data stored in the reference register to an adjacent, less significant bit storage location in the reference register.

9. The method of claim 6, wherein sequentially inputting the reference data comprises sequentially inputting each bit of the reference data into a current bit storage location of the reference register, wherein:
- if no bit of the reference data has been input into the reference register yet, then the current bit storage location of the reference register is a designated initial stack location;
- if the first data is not the same as the at least a portion of the second data after a bit of the reference data has been input to a first bit storage location of the reference register, wherein the first bit storage location is also the current bit storage location, then a second bit storage location becomes the current bit storage location, wherein the second bit storage location is adjacent to the first bit storage location and has a higher order than the first bit storage location; and
- when the second data stored in the reference register is shifted, each bit of the second data is shifted from one bit storage location to an adjacent, lower order bit storage location in the reference register.

10. The method of claim 9, wherein:
- the reference register comprises a comparison register and a stack register; and
- the designated initial stack location of the reference register is the highest order bit storage location of the comparison register.

11. The method of claim 10, wherein the lowest order bit storage location of the stack register is the adjacent bit storage location to the highest order bit storage location of the comparison register.

12. The method of claim 6, wherein a comparison unit determines whether the first data is the same as the at least a portion of the second data.

13. The method of claim 12, wherein:
- the reference register comprises a control register;
- the output of the comparison unit is input into the control register; and
- the control register controls the shifting of the data in the reference register depending on the output of the comparison unit.

14. The method of claim 13, wherein the output of the comparison unit is stack or shift information.

15. The method of claim 13, further comprising determining whether the tested memory device is defective using the output of the comparison unit.

16. A method of testing a semiconductor memory device, the method comprising:
- serially providing data bits of a data pattern to a memory cell array unit;
- storing the data bits of the data pattern in the memory cell array unit;
- serially providing output data from the memory cell array unit to an output shift register storing first data bits;
- updating the first data bits by shifting the first data bits and subsequently storing one of the data bits of the output data provided to the output shift register as one of the first data bits;
- outputting N of the first data bits from the output shift register;
- serially providing the data bits of the data pattern to a reference shift register storing second data bits;
- outputting N of the second data bits;
- updating the second data bits using a first update operation when stack or shift information indicates a first logic state;
- updating the second data bits using a second update operation when the stack or shift information indicates a second logic state;
- comparing the N first data bits with the N second data bits; and
- generating the stack or shift information, wherein the logic state of the stack or shift information corresponds to a result of comparing the N first data bits with the N second data bits,
- wherein the first update operation comprises storing one of the data bits of the data pattern provided to the reference shift register as one of the second data bits without shifting the second data bits, and
- wherein the second update operation comprises shifting the second data bits and storing the one of the data bits of the data pattern provided to the reference shift register as one of the second data bits.

17. The method of claim 16,
- wherein the first update operation further comprises storing the one of the data bits of the data pattern provided to the reference shift register in a stack register storing a first portion of the second data bits or in a comparison register storing a second portion of the second data bits without shifting the first portion or the second portion of the second data bits, and
- wherein the second update operation further comprises shifting the second data bits and subsequently storing the one of the data bits of the data pattern provided to the reference shift register in the stack register or the comparison register.

18. The method of claim 17, further comprising outputting the stack or shift information to the outside of the semiconductor memory device using an output pin bonded to a pad.

19. The method of claim 17, wherein the stack register has a capacity sufficient to store at least a number of the data bits of the data pattern wherein the number of the data bits corresponds to a latency between writing and reading operations in the semiconductor device.

20. The method of claim 16, further comprising outputting the output data to the outside of the semiconductor memory device using an output pin bonded to a pad.

* * * * *